(12) United States Patent
Ressler et al.

(10) Patent No.: US 6,379,785 B1
(45) Date of Patent: Apr. 30, 2002

(54) GLASS-COATED SUBSTRATES FOR HIGH FREQUENCY APPLICATIONS

(75) Inventors: Kevin Glenn Ressler, Arlington; Jim-Yong Chi, Lexington, both of MA (US)

(73) Assignee: Tyco Electronic Corp, Wilmington, DE (US)

(*) Notice: Subject to any disclaimer, the term of this patent is extended or adjusted under 35 U.S.C. 154(b) by 0 days.

(21) Appl. No.: 09/001,950

(22) Filed: Dec. 31, 1997

(51) Int. Cl.[7] .............................. B32B 3/12; B32B 3/26; H01L 23/58
(52) U.S. Cl. ................. 428/304.4; 428/158; 428/210; 428/428; 428/446; 257/634; 257/638; 257/644; 257/650
(58) Field of Search .................... 428/316.6, 428, 428/446, 444, 172, 178, 901, 426, 304.4, 158, 161, 210; 257/650, 644, 634, 638, 641; 438/182, 622, 781, 782

(56) References Cited

U.S. PATENT DOCUMENTS

| | | | | |
|---|---|---|---|---|
| 4,956,208 A | * | 9/1990 | Uchikawa et al. | 428/34.6 |
| 5,102,822 A | | 4/1992 | Calligaro | 437/67 |
| 5,268,310 A | | 12/1993 | Goodrich et al. | 437/15 |
| 5,639,325 A | | 6/1997 | Stevens et al. | 427/96 |
| 5,696,466 A | | 12/1997 | Li | 330/286 |
| 5,719,084 A | * | 2/1998 | Mallon et al. | 438/783 |

FOREIGN PATENT DOCUMENTS

| | | | | |
|---|---|---|---|---|
| EP | 0 342 094 | 11/1989 | | H01L/21/76 |
| EP | 0 534 271 A2 | 3/1993 | | H01L/21/331 |
| EP | 0 592 002 | 4/1994 | | H01L/23/482 |
| WO | WO 97/35340 | 3/1997 | | H01L/21/762 |

OTHER PUBLICATIONS

"Glass Microwave IC Packaging Technology", Publication Date, 10.05.94, Presented by Richard Perko, M/A–COM Inc., Electro International 1994, Hynes Convention Center, Boston, MA, May 10–12, 1994, pp. 857–862.

A New Technology For Si Microwave Power Transistor Manufacturing, XP–002053834, Ping Li, Corp. R&D Center, M/A–COM, Inc. Lowell, MA 01853, Timothy Boles, Burlington Semiconductor Operation M/A–COM Inc., Burlington, MA 01803, pp. 103–106.

International Serch Report, Applicant's Reference 16573 PCT, International Application No. PCT/US 97/03468, International Filing Date, 17/03/1997.

U. S. Patent Application No. 08/640,290, Docket No. 16422, Entitled: "Process For Reducing Bond Resistance In Semiconductor Devices And Circuits". Filed Jul. 22, 1996.

* cited by examiner

*Primary Examiner*—Donald J. Loney

(57) ABSTRACT

A substrate, preferably silicon, or other suitable material has a layer of glass material disposed thereon. The glass material of the present disclosure has a substantially increased uniformity due to the reduction in bubbles as well as a relatively smooth top surface. By virtue of the reduction in the number and size of the bubbles in the glass the dielectric properties of the glass are more uniform. Additionally, the fact that the surface of the glass is much more smooth reduces the potential of prior structures to have an unacceptably thin glass layer due to the need to grind the surface smooth.

27 Claims, 6 Drawing Sheets

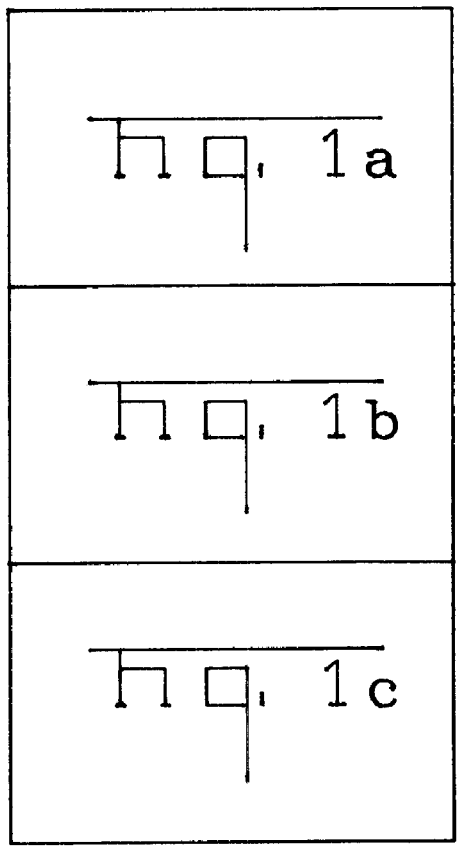
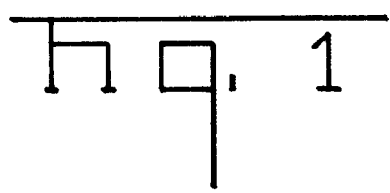

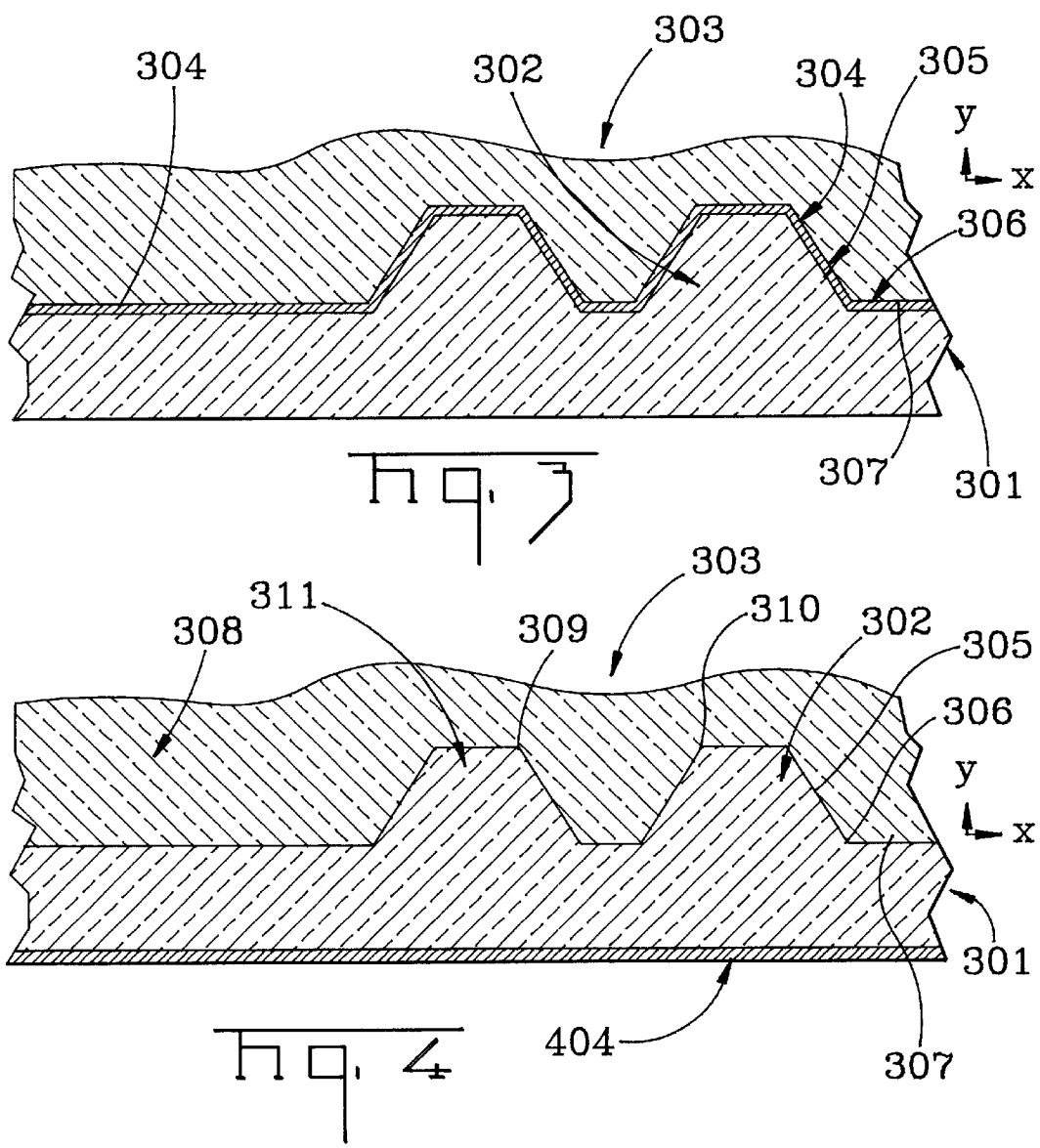
Fig. 3
Fig. 4
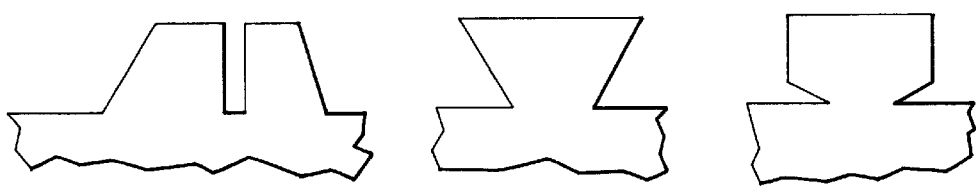
Fig. 5

GLASS-COATED SUBSTRATES FOR HIGH FREQUENCY APPLICATIONS

GOVERNMENT RIGHTS

This invention was made with Government support under Agreement No. F33615-94-2-1524 awarded by the United States Air Force, Wright Laboratory. The Government has certain rights in the invention.

FIELD OF THE INVENTION

The present invention relates generally to a structure for high frequency applications have a substrate on which a glass layer is disposed with improved uniformity and thickness and significantly lower cost compared to prior art.

BACKGROUND OF THE INVENTION

Printed circuit boards (PCBs) are used extensively in the electronics arts to mount and interconnect discrete electronic components (integrated circuit chips, etc.) to implement a specific function. Commonly, the board substrate is made of polymers and ceramics, although other materials such as silicon or other semiconductors can be used. It is often desirable to electrically isolate certain components mounted on the PCB from each other and from the board substrate. Typically, this is accomplished by applying one or more layers of dielectric material to the surface of the board and then mounting the components on or in the dielectric layers. For high frequency electronic applications, thick dielectrics layers over conductive substrates are needed to form transmission lines.

Common techniques for forming dielectric layers on a wafer of silicon include chemical vapor deposition (CVD) and spin-on-glass (SOG) techniques. These processes are essentially limited to producing dielectric layers of only several microns in thickness, due the to inability to effectively prevent cracking in layers of greater thickness and/or their prohibitively slow formation rates. Because of the limitations of thickness of the dielectric layers produced by the above techniques, capacitive coupling problems are not reduced to acceptable levels. That is, capacitive isolation between the substrate and components is not reduced to an acceptable level. The limited thickness of the dielectric layer prevents its use for transmission line applications. Additionally, many of these processes are incapable of forming a dielectric layer having a sufficiently high dielectric constant (e.g., at least 4.1 at 20 degrees C. and 1 MHz) and sufficiently low loss tangent (e.g., at most 0.06 percent at 20 degrees C. and 1 MHz) to permit use of the resulting board in high performance electronics applications (e.g. microwave and/or other radio frequency circuit applications).

Other techniques used conventionally in the fabrication of glass-on-silicon make use of the bonding of a glass wafer to a silicon wafer. This process has certain advantages, for example the ability to maintain an acceptably thick layer of glass for transmission line use, as well as an acceptably thick layer of glass/silicon during processing to prevent cracking and thus improve yield. Unfortunately, these techniques require a circumferential lip to effectively bond the glass to the silicon. This technique renders, thereby, a portion of the wafer not useful. The techniques discussed herein can be found in U.S. patent application Ser. No. 08/845,726 now U.S. Pat. No. 6,114,716 to Boles, et al. and U.S. Pat. Nos. 5,268,310 and 5,343,070 to Goodrich, et al., the disclosures of which are specifically incorporated herein by reference.

Additionally, discontinuities due to pockets or voids in the glass result in unacceptable dielectric properties and result in an unacceptable degradation in the electrical properties of the resultant heterolithic microwave integrated circuit. To this end, at the corners of a silicon pedestal there is a tendency for a void to form between the silicon and the glass. While the technique used to fabricate the HMIC structure shown in the referenced application to Boles, et al., serves to reduce the voids to acceptable levels, the silicon structures forming the pedestals are limited to those formed by wet-etching techniques. To this end, the silicon is monocrystalline and is anisotropically etched to reveal crystalline planes. These planes enable the bonding of glass without significant voids, however there are certain limitations. The presence of these air gaps both limits the size of the pedestals and forces a minimum spacing between pedestals. It has been found that with the technique of fusing the glass and the problems with the air gaps or voids requires the pedestals to be spaced no less than 300 microns apart, with the distance between the pedestals being measured from the near edges of the pedestals at the top of the pedestals. To this end, if the pedestals are spaced too closely, these voids or air gaps become nearly continuous or continuous. This has obvious deleterious effects on the electrical properties of the structure, and significantly adversely affects the adhesion of the glass to the substrate. Thus, the pedestals must be spaced relatively far apart as these factors reduce the number of dies that can be fabricated on a wafer and reduces the number of chips that can be placed on a given substrate. Furthermore, the cost of glass wafers are substantially higher than the cost of the silicon wafer and becomes prohibitively more expensive for wafer diameters larger than 100 mm. Finally, vertical pedestals with substantially right angle corners can not be used due to the large air gaps and poor adhesion of the glass thereto. Another technique for fabricating relatively thick layers of electronics grade glass on silicon substrates at lower cost is as disclosed in U.S. Pat. No. 5,639,325 to Stevens, et al. The patent to Stevens, et al., discusses the use of a slurry of glass powder which is prepared with a variety of carriers to include volatile organic solvents and/or water. Additionally, the use of hydrogen is discussed at an ambient temperature of 800° C. This reference to Stevens, et al., while having clear advantages when compared to other techniques for forming a glass layer on a silicon substrate and the article thereby produced compared to the prior techniques, there are certain drawbacks which are inherent in the Stevens, et al. technique. To this end, the reference to Stevens, et al., discloses the use of a particle size of the powder which has an average granular size of about 325 mesh. Particle size as well as variations in the size of the particles can be problematic.

In many applications thin glass layers are required, on the order of 5.8 mils. For example, as is disclosed on U.S. patent application Ser. No. 08/845,726, to Boles et al. referenced above, it is necessary to backfill 5–8 mils of glass in thickness between silicon pedestals which are on the order of 3–4 mils in height. When particle size variation ranges in the order of 5–100 microns, it is difficult to effect this desired thickness without multiple firings. To this end, islands on the order of 1 mil can form on the relatively thin glass layer on the order of 0.5 microns which is formed in the first firing. The process must then be repeated to continually increase the thickness and make more uniform the regions between the islands. The reason that the islands are formed is due to surface energy effects which occur when the powder starts to melt and, due to the variation in size, starts to melt into clumps. Accordingly, it is desirable to have a process to fabricate the relatively thick glass layer on the order of 4–12 mils in a variety of applications in a single firing. Another significant drawback to the technique disclosed in the Stevens, et al. patent, is the fact the hydrogen bubbles of a relatively large size remain in the glass as well, creating "pock" marks on the surface. The technique disclosed in the reference to Stevens, et al., has clear advantages over prior techniques of forming glass, particularly in a slurry as the hydrogen bubbles are significantly reduced compared to the air bubbles that form when no firing under partial pressure of hydrogen is effected. However, these craters and bubbles have clear disadvantages in uniformity. The hydrogen bubbles can reduce the electronic performance because the glass is not as uniform of a dielectric as is required in electronics grade, particularly high frequency where capacitive coupling is an issue which must be attended to very carefully. Often, the thickness of the glass is reduced to an undesirable level in order to properly grind and polish the surface.

Accordingly, what is needed is a glass layer disposed on a silicon substrate which has more uniformity and greater thickness than in prior structures.

SUMMARY OF THE INVENTION

The present invention relates to a structure for high frequency electronic applications. A substrate, preferably silicon, or other suitable material has a layer of glass material disposed thereon. A ground plane layer can be disposed between the silicon and the glass a layer or, in some applications, disposed beneath the silicon layer. Two terms for such a glass-coated article having glass disposed on a silicon substrate are heterolithic microwave integrated circuit (HMIC) and glass microwave integrated circuit (GMIC). The silicon pedestals of the present disclosure can be doped suitably to be conductive, and the dielectric material disposed about these conductive silicon pedestals form a substrate for the integrated circuit. The dielectric material used in fabricating the dielectric layer between signal lines and elements disposed on top of the glass-coated article and the ground plane for the integrated circuit on the lower surface of either the silicon, or the glass, should have a very precise thickness as well as dielectric properties which are very uniform. The thickness and uniformity are required to properly effect the performance and impedance matching of the integrated circuit to include the transmission lines as well as passive and active components of the integrated circuit. The glass must be a low-loss material at high frequency, and, as stated previously, of a thickness which enables capacitive isolation. To this end, reduction of parasitic capacitance is of critical importance in high frequency integrated circuits, as is well known to one of ordinary skill in the art. In the preferred embodiment of the present disclosure, in which there are silicon pedestals, the silicon pedestals have a height on the order of 3–9 mils. The thickness of the glass layer disposed about the silicon pedestals is on the order of 3–12 mils. The glass material fabricated as described herein has a substantially increased uniformity due to the reduction in bubbles as well as a relatively smooth top surface. By virtue of the reduction in the number and size of the bubbles of gas in the glass, the dielectric properties of the glass are more uniform. Additionally, the fact that the surface of the glass is much more smooth reduces the potential of prior structures to have an unacceptably thin glass layer due to the need to grind the surface smooth. As described herein, often times in prior glass materials the thickness becomes unacceptably reduced. The bubble size achievable with the steps described in Stevens et. al's patent is approximately the size of the glass powder used, or around 40 mils for 325 mesh glass powder. The density of the bubbles will be very high and most of the bubbles are clustered with others. In the present invention, the bubbles are individual and discrete. To this end, the bubbles which result in the bulk of the glass product of the present invention are significantly reduced in volume when compared to the prior art. Measurements have shown that the bubbles are of an oblong shape with a width on the order of 10–30 microns and a height which is virtually insignificant when compared to the width. This has a direct benefit as the dielectric constant has a uniformity which is identical (within measurement accuracy) to the glass wafers of the prior art. Because the cost of the glass of the present disclosure is drastically reduced when compared to the wafer glass of the prior art, the invention of the present disclosure has a significant advantage over the prior art. In addition the loss tangent has a value which is identical (again within measurement accuracy) to the glass wafer of the prior art. The glass has clear advantages when compared to the bulk wafer glass, and dielectric and loss tangent properties which are the same as the bulk glass, making the glass of the present disclosure a very attractive alternative. In summary therefore, the glass of the present invention has electrical (dielectric and loss tangent) properties which compare very favorably with the wafer glass, and the versatility and reduction in cost when compared to the glass described in the Stevens, et al patent.

The silicon substrate of the present disclosure can take on a number of shapes. To this end, the preferred embodiment of the present disclosure envisions anisotropically etched silicon pedestals. This is effected through a wet-etch technique in which the side surfaces of the pedestals have a specific angle relative to the bottom surface (a commonly used silicon crystalline structure results in an angle of approximately 54 degrees) of the substrate of silicon. This follows directly from the crystalline nature of the monocrystalline material. Alternatively, the silicon substrate could be planar. Finally, pedestals and other structures are envisioned by the present disclosure which have side surfaces which are orthogonal to the bottom surface of the silicon. This is generally done by a dry-etching technique, preferably reactive ion etching, well known to one of ordinary skill in the art. The glass of the present disclosure is readily adhered to such a structure without significant air gaps as plague the prior art. Whether the pedestals have vertical or sloped sidewalls, the air gaps that form in the interface or transition between the horizontal surface of the substrate and the sidewall by the glass adhesion techniques of the wafer-glass to the substrate of the prior art are overcome by the invention of the present disclosure which enables improved electrical properties and good adhesion of the glass to the substrate. This has the advantages of decreased spacing between the pedestals, and thus an increase in the number of dies per wafer and an increase in the number of chips on a substrate. Accordingly, the glass material of the present disclosure enables a variety of applications, as can be readily appreciated by one of ordinary skill in the art.

OBJECT, FEATURES AND ADVANTAGES

It is an object of the present invention to have a substantially uniform dielectric glass material with a thickness great enough to reduce parasitic capacitances in high frequency applications.

It is a feature of the present invention to have a glass material which has significantly reduced bubble sizes and number of bubbles in the glass, as a result of the specific glass powder particle size distribution discussed herein.

It is advantage of the present invention to have a glass material for microwave integrated circuits which is disposed on silicon substrates of a wide variety of shapes.

BRIEF DESCRIPTION OF THE DRAWINGS

FIG. 3 is a cross-sectional view of a layer of glass on a silicon substrate having pedestals disposed therein.

FIG. 4 is a cross-sectional view of the glass layer disposed on a silicon substrate having the ground plane on the bottom surface of the silicon.

FIG. 5 shows exemplary shapes of pedestals that can be used with the invention of the present disclosure

DETAILED DESCRIPTION OF THE INVENTION

The present application is related to U.S. Patent Application Number (The Whitaker Corporation Docket Number 17170) entitled "Process for Manufacturing Glass/Si Substrates for Microwave Integrated Circuit Fabrication", filed on even date herewith, the disclosure of which is specifically incorporated herein by reference.

The preferred embodiment of the present disclosure is drawn to the preparation and disposition of a glass layer on a substrate. Preferably, this substrate is one of silicon, more preferably monocrystalline silicon. Alternatively, as will be described herein, polycrystalline silicon and amorphous-silicon can also be used. The contour or structure of the silicon can have pedestals, but also can be substantially planar. In the event that the structure has a substantially planar silicon substrate, metalization is disposed on top of the substrate, thereby between the substrate and the layer of glass. As the metalization technique is known, it will not be discussed in detail herein. To this end, the above captioned patent application to Stevens, et al., which is specifically incorporated by reference, teaches the preferred technique for metalization, particularly when the metalization is between the glass and silicon layers. Additionally, it is well known to one of ordinary skill in the art that components and transmission line structures are disposed on the top surface of the glass layer. Accordingly, as this is well known to one of ordinary skill in the art, the components disposed on the top as well as the methods of disposing them will not be discussed in detail. The components as well as the methods for disposing them on the top surface of the glass are those which would be known to one of ordinary skill in the art.

Figure 1A:
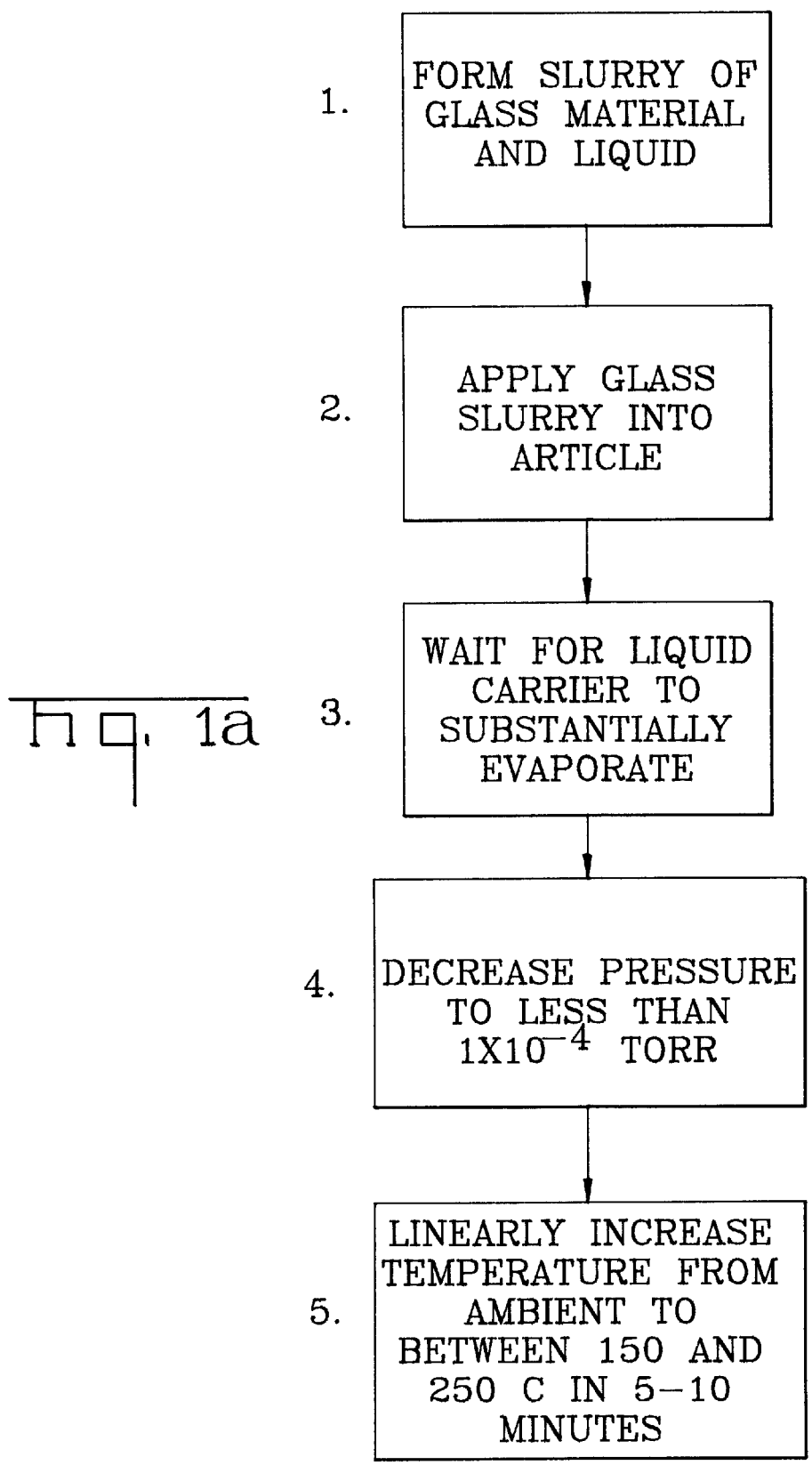
FIGS. 1a–1c is a flow chart showing the preferred process steps of the technique use to fabricate the glass layer of the present invention.
Figure 1B:
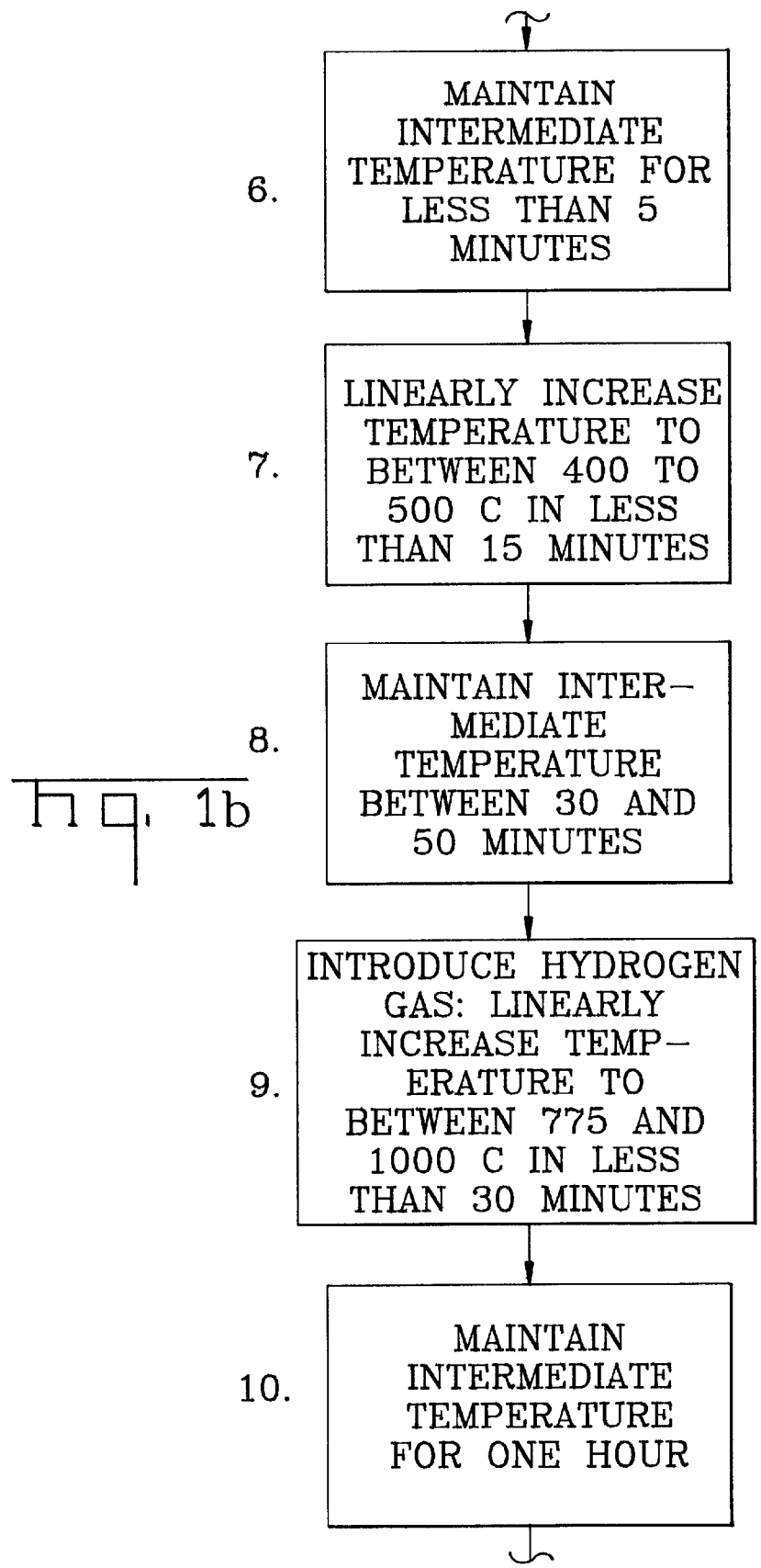
Figure 1C:
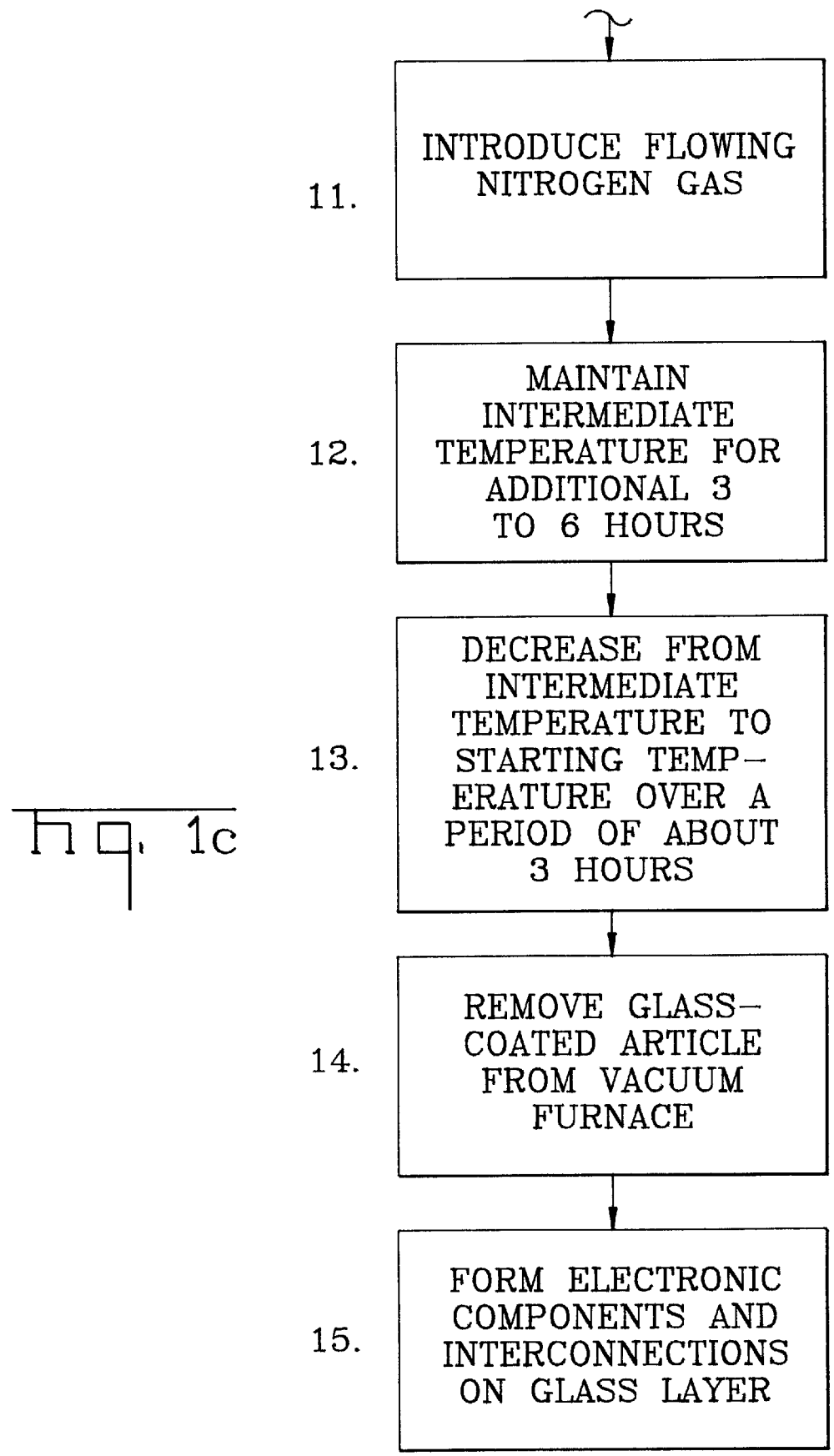

The first step in the process is preparation of the glass slurry. Preferably, the application of the glass materials is accomplished forming a slurry or paste of powdered (commonly known as frit) glass material in liquid. This is shown in FIG. 1 at block 1. The particle size distribution of the frit powder is of critical importance as has been described previously. The discovery of the particle size and particle size distribution and the effect thereof in eliminating the voids and discontinuities that plague prior art techniques for fabricating glass layers is that the mean particle size distribution should be between 15–25 microns, with no particles having a diameter greater than 100 microns. Additionally, it has been found that the distribution should contain a minimum number of fine particles with sub-micron size. Preferably, the slurry is composed of mass ratios of glass powder to liquid between 1:1 and 2.0:1. These ratios result in a slurry of sufficiently low enough viscosity to enable applying the slurry onto the second adhesion layer (not shown). Additionally, the liquid is preferably isopropanol.

After preparation of the slurry, the slurry is applied on to the top surface of the second adhesion layer shown as block 2. The slurry application method is preferably pouring, although other slurry applications well-known to practitioners of glass and ceramics processing, such as tape casting, screen printing, or spin coating, could be used. The slurry is permitted to dry via evaporation of the liquid carrier. This process can be accelerated by elevating the temperature to accelerate evaporation of the carrier and minimize moisture adsorption.

Thereafter, the firing sequence is initiated. The firing sequence is conducted as follows. The pressure around the article is pumped down to a pressure preferably less than $1 \times 10^{-4}$ and at room temperature. This aids in the removal of any residual liquid or carrier. Thereafter, with the pressure approaching less than $10^{-4}$, the temperature is raised substantially linearly to 200° C. in a period of approximately five minutes. This tends to drive off any remaining liquid. The temperature is maintained at 200° C. for approximately five minutes. As can be seen from blocks 5 and 6, it is possible to have a range in the temperature as well as in the time to increase the temperature. In contrast, the preferred technique as discussed herein is shown FIG. 2 in tabular form. The next step in the process requires the linear increase in temperature, maintaining vacuum ($1 \times 10^{-4}$ torr) which occurs in a period of less than fifteen minutes. This is shown in block 7. The final temperature is preferably 450° C. with an acceptable range of 400–500° C. at this step. The substrate and glass layer thereon are maintained at this temperature again preferably 450° C., and vacuum pressure of $1 \times 10^{-4}$ torr for preferably forty minutes with a preferred range of 30–45 minutes. This initial reduction in pressure and heating cycle are for the purpose of slowly heating the layer of glass to 450° C. in vacuum in order to remove any residual isopropanol or gases which have adhered from the glass powder. This initial sequence takes preferably 58 minutes. At this point, hydrogen preferably, or helium, is introduced into the chamber to surround the unfired glass layer at a pressure of approximately 1 atmosphere (760 torr). The gas diffuses very rapidly through the porous, unmelted glass powder. As the glass powder melts into one uniform layer upon heating to 800° C., bubbles form at the interstices between glass powder particles which are melting together. These bubbles are filled with hydrogen or helium depending on which is used. Either of the gases have a very high diffusion coefficient through glass but to a very small molecular size. The introduction of hydrogen with the linear increase in temperature to preferably 800° C. is shown at block 9. This is effected in a period of less than 30 minutes.

The glass/substrate particle is maintained at the temperature of approximately 800° C. for a period of approximately one hour as is shown in block ten of FIG. 1. Hydrogen gas is flowing for both the temperature and pressure as set forth in block 9 and for the one hour period. At the intermediate temperature shown at block 10 an ambient of hydrogen prior to and during the melting of the glass at the intermediate temperature fills the resulting bubbles in the glass with a gas that diffuses relatively quickly in the glass. Hydrogen diffuses quickly from the bubbles accelerating the rate of bubble shrinkage as well as removal of the bubbles from the glass.

Figure 2:
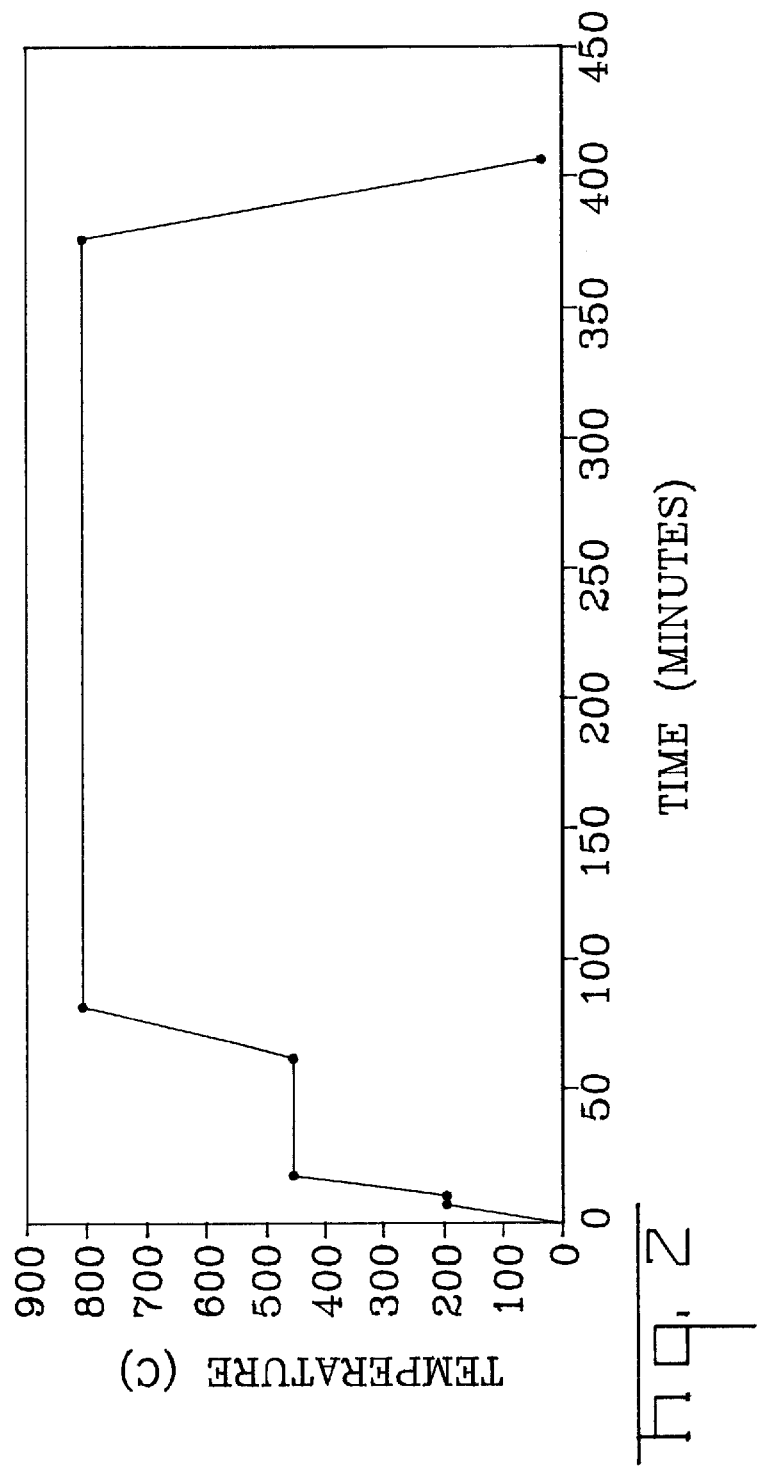
FIG. 2 is a tabular representation of the firing schedule to obtain the glass-coated article for electronics applications with a graphical representation of the firing schedule.

The next step in the process is the introduction of nitrogen gas which is shown at block 10 in FIG. 1, as well as in tabular form and graphical form in FIG. 2. This is a significant improvement over prior techniques as has been discussed above. The introduction of nitrogen at a pressure slightly greater than 1 atmosphere is maintained for a period of approximately 2–6 hours. The introduction of nitrogen significantly decreases the partial pressure of hydrogen, establishing a concentration gradient that further enhances the removal of the hydrogen from the glass. In addition, the gas particles having hydrogen therein in the glass have a tendency to further diffuse and thereby reduce in size due to the reduction of the partial pressure of hydrogen. The glass particles melt and flow together shown at blocks 9, 10, 11, and 12. Thereafter, in a final stage which lasts preferably for 2–4 hours, the temperatures decrease from the intermediate temperature to the beginning or ambient temperature in a linear fashion. Again this is over a period of approximately 3 hours. By following this multiple stage process, substantially all air pockets, voids, deformities and surface roughness encountered in the prior art are eliminated out of the flowing glass, and the glass becomes more uniform and is bonded to the underlying article. As a result, the bubbles which result in the bulk of the glass product 308 of the present invention are significantly reduced in volume when compared to the prior art. Measurements have shown that the bubbles are of an oblong shape with a width on the order of 10–30 microns and a height or thickness on the order of 0.03 microns (300 Angstroms). The width of the bubbles is in the x-direction while the height or thickness is in the y-direction, as shown in FIGS. 3 and 4. Advantageously, in the embodiment in which the multiple layer metalization is used, the second adhesion material layer increases the ability of the glass to bond to the underlying article so that the problems of edge rollback and other non-uniformities are substantially eliminated. Again, this is as discussed in the above captioned reference to Stevens, et al.

It should be noted that other gases besides hydrogen can be used in the above captioned process. Other small-molecular diameter gases which have high diffusivities in glass, to include helium or neon as well as others within the purview of the artisan of ordinary skill can be substituted for hydrogen in blocks 9 and 10 of FIG. 1. Additionally, firing times of longer duration can be required to obtain a comparable glass article produced by firing in hydrogen. With bubbles filled with inert gases, bubble removal from glass occurs primarily through the floatation of gas-filled bubbles to the surface, a very time consuming process. Hydrogen, unlike inert gases, can chemically integrate into the glass during firing enabling the bubbles to collapse via hydrogen absorption by the glass matrix in addition to the common bubble floatation mechanism operative with other enclosed gases. This is a very important vehicle in the process described above.

The articles are then cooled from the glass-melting temperature to ambient temperature as shown in block 14. Block 15 shows the general step to form the electronic components and interconnections on the glass layer.

The desired thickness of the glass is effected through a mechanical grinding and polishing step, with subsequent fabrication of circuit elements, components and interconnections effected using conventional techniques. The intermediate products after the annealing step but prior to the mechanical grinding step are shown in FIGS. 3 and 4. FIG. 3 shows the substrate, again preferably of monocrystalline silicon to 301 with pedestals 302. The glass material 303 is disposed thereon. The pedestals are formed through a standard wet etching technique, as is discussed in the above captioned patent application to Boles, et al. A ground plane layer 304 is disposed on the the silicon pedestals and flat surfaces, or between the glass and the silicon. Again, the pedestals serve various and sundry purposes within the purview to one of ordinary skill in the art. Again, the reference to Boles, et al. discloses various techniques for using the pedestals and electronic components as for example doping to form a proper connection to ground. FIG. 4 shows virtually the same structure as in FIG. 3 however with the ground plane shown at 404 disposed on the bottom surface of the substrate. An alternative approach which is possible with the invention of the present disclosure would be one in which the pedestals rather than having the characteristic angle or angular sides, for example as shown at 305 with the transition to the flat surface shown at 306 would be one in which the pedestals have a much more vertical profile. That is the sides 305 would be orthogonal to the flat surface 307 of the silicon substrate. Such a shape or profile would not be possible with prior techniques which fuse a glass wafer to a substrate, as voids would certainly form in the region 306. Additionally, poor adhesion is effected by prior techniques to dispose the glass material in a structure having a profile with a more vertical pedestal, again one in which the sides 305 are substantially perpendicular to the flat surface 307 of the silicon. Accordingly, such a structure can be effected through other etching techniques to include reactive ion etching (RIE) and others well known. Because of this, a variety of options are available to the artisan of ordinary skill in the use of the silicon pedestals. Furthermore, because monocrystalline materials are not required to effect the pedestals, etching can be effected on polysilicon as well as amorphous silicon as the artisan sees fit. Finally, the pedestal 302 and 311 can be spaced more closely together without the formation of a large or continuous void, which adversely affects the dielectric characteristics, loss tangent and adhesion of the glass to the substrate, To this end, as is shown in FIG. 4, for example, the distance between near corner 309 of pedestal 311 and near corner 310 of pedestal 302 is less than 300 microns, which cannot be effected by the prior art glass techniques due to the problems of air gaps as discussed at length above. While the pedestal side walls have been exemplary 54 degrees and 90 degrees throughout the discussion above, the present invention provides a great deal of latitude with respect to the pedestals. To this end, the present invention avoids air pocket formation in substrates that have pedestals of almost any shape. The angle between the side wall of the pedestal and flat surface of the substrate can be between zero degrees and 180 degrees as long as the pedestals are stable against mechanical vibrations during fabrication. In contrast, sharp intersections would leave air pockets if the prior art glass fusion technique were used. Accordingly, as can be appreciated, a great deal of freedom in the choice of pedestal geometries is obtained by the present invention. FIG. 5 shows some examples of pedestal shapes. These are for purposes of example and are not intended to be limiting.

The invention having been described in detail, it was in the purview to one of ordinary skill in the art to modify the teachings of the present disclosure without departing from the theme and spirit of the invention. To the extent that variations and modifications are within the purview of artisan of ordinary skill having the benefit of the present disclosure, such modifications are deemed within the scope of the invention, an improved process for fabricating electronics grade glass on substrates having an improved uniformity due to the increase in removal of bubbles as well as a reduction in their size through the process steps disclosed herein.

What is claimed is:

1. An article capable of supporting electronic devices operable at high frequency for signal transmission, comprising:
   a substrate having a first pedestal and a second pedestal, said first pedestal having a near top corner and said second pedestal having a near top corner, said near top corner of said first pedestal and said near top corner of said second pedestal being spaced a distance of less then 300 microns apart; and
   a glass layer disposed on said substrate and surrounding said pedestals, said glass layer having a loss tangent no greater than 0.06% at 20° C. and 1 MHz and a thickness sufficient to enable capacitive isolation of said substrate during high frequency operation of devices supported isolated thereby, and having bubbles therein, wherein said bubbles have a width between 10 to 30 microns.

2. An article as recited in claim 1, wherein said pedestals have transition regions between sidewalls of said pedestals and a flat surface of said substrate and said transition regions have said glass layer disposed therein and said regions being free of air gaps.

3. An article as recited in claim 2, wherein said substrate is monocrystalline and said sidewalls and flat surface form an angle of approximately 54°.

4. An article as recited in claim 2, wherein said sidewalls of said pedestals and said flat surface of said substrate form an angle of approximately 90°.

5. An article as recited in claim 4, wherein said substrate is polycrystalline silicon.

6. An article as recited in claim 1, wherein said bubbles have a thickness of approximately 0.03 microns.

7. An article as recited in claim 1, wherein said substrate comprises a semiconductor material having a metalization layer provided thereon, said metalization layer defining the top surface of said substrate and being disposed between said semiconductor material and said glass layer.

8. An article as recited in claim 7, wherein said semiconductor material is one of monocrystalline silicon, polycrystalline silicon, and amorphous silicon.

9. An article as recited in claim 1, wherein said substrate is one of polycrystalline silicon and amorphous silicon.

10. An apparatus operable at high frequency for signal transmission, comprising:
    at least one electronic component characterized by high frequency operation;
    a substrate having a top surface and a bottom surface, said substrate having at least one integral pedestal; and
    a glass layer disposed on said top surface and surrounding said at least one pedestal, said glass layer being interposed between said at least one electronic component and said substrate and having a thickness sufficient to enable capacitive isolation of said substrate during high frequency operation of said at least one electronic component, and said glass layer having bubbles therein, wherein said bubbles have a width between 10–30 microns.

11. An apparatus as recited in claim 10, wherein said at least one pedestal has a transition region between a sidewall of said pedestal and a flat surface of said substrate; and
    said transition region having said glass layer disposed therein in said region being free of air gaps.

12. An apparatus as recited in claim 11, wherein said substrate is monocrystalline silicon and said sidewall and said flat surface form an angle of approximately 54°.

13. An apparatus as recited in claim 11, wherein said sidewall of said pedestal and said flat surface of said substrate form an angle of approximately 90°.

14. An apparatus as recited in claim 10, wherein said bubbles have a thickness of approximately 0.03 microns.

15. An apparatus as recited in claim 10, wherein said substrate comprises a semiconductor material having a metalization layer provided thereon, said metalization layer defining the top surface of said substrate and being disposed between said semiconductor material and said glass layer.

16. An apparatus as recited in claim 15, wherein said semiconductor material is one of monocrystalline silicon, polycrystalline silicon, and amorphous silicon.

17. An apparatus as recited in claim 10, wherein said substrate is one of polycrystalline silicon and amorphous silicon.

18. The apparatus of claim 10, further including at least one transmission line defined on said glass layer.

19. The apparatus of claim 10, wherein said glass layer has a loss tangent no greater than 0.06% at 20° C and 1 MHz.

20. An apparatus operable at high frequency for signal transmission, comprising:
    at least one electronic component characterized by high frequency operation;
    a substrate having at least one integral pedestal, said pedestal having sidewalls and said sidewalls having a transition region to a flat surface of said substrate;
    a glass layer disposed on said substrate and interposed between said at least one electronic component and said substrate, said glass layer having a thickness sufficient to enable capacitive isolation of said substrate during high frequency operation of said at least one electronic component and a loss tangent no greater than 0.06% at 20° C. and 1 MHz; and
    said transition region having said glass therein, said region being free of air gaps.

21. An apparatus as recited in claim 20, wherein said glass layer has bubbles and said bubbles have a width between 10 and 30 microns.

22. An apparatus as recited in claim 20, wherein said substrate is monocrystalline silicon and said sidewall and said flat surface form an angle of approximately 54°.

23. An apparatus as recited in claim 20, wherein said sidewall of said pedestal and said flat surface of said substrate form an angle of approximately 90°.

24. An apparatus as recited in claim 21, wherein said bubbles have a thickness of approximately 0.03 microns.

25. An apparatus as recited in claim 20, wherein said substrate comprises a semiconductor material having a metalization layer provided thereon, said metalization layer defining the top surface of said substrate and being disposed between said semiconductor material and said glass layer.

26. An apparatus as recited in claim 25, wherein said semiconductor material is one of monocrystalline silicon, polycrystalline silicon, and amorphous silicon.

27. An apparatus as recited in claim 20, wherein said substrate is one of polycrystalline silicon and amorphous silicon.

* * * * *